United States Patent
Kim et al.

(10) Patent No.: US 10,590,533 B2
(45) Date of Patent: Mar. 17, 2020

(54) METHOD OF MANUFACTURING DISPLAY APPARATUS UTILIZING MASK ASSEMBLY INCLUDING INTERMEDIATE LAYER AND SELF-ASSEMBLED MONOLAYER

(71) Applicant: Samsung Display Co., Ltd., Yongin-si (KR)

(72) Inventors: Jaesik Kim, Yongin-si (KR); Wooyong Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/176,669

(22) Filed: Jun. 8, 2016

(65) Prior Publication Data

US 2017/0121816 A1 May 4, 2017

(30) Foreign Application Priority Data

Oct. 28, 2015 (KR) ........................ 10-2015-0150267

(51) Int. Cl.

| | | |
|---|---|---|
| *C23C 14/04* | (2006.01) | |
| *C23C 16/455* | (2006.01) | |
| *C23C 14/56* | (2006.01) | |
| *C23C 14/34* | (2006.01) | |
| *C23C 16/04* | (2006.01) | |
| *H01L 51/56* | (2006.01) | |
| *B05D 1/32* | (2006.01) | |
| *H01L 51/52* | (2006.01) | |

(52) U.S. Cl.
CPC ...... *C23C 16/45525* (2013.01); *C23C 14/042* (2013.01); *C23C 14/34* (2013.01); *C23C 14/564* (2013.01); *C23C 16/042* (2013.01); *B05D 1/32* (2013.01); *H01L 51/52* (2013.01); *H01L 51/56* (2013.01)

(58) Field of Classification Search
CPC ..... C23C 14/042; C23C 14/34; C23C 14/564; C23C 16/042; C23C 16/45525; B05D 1/18532; H01L 51/52; H01L 51/5153
USPC ............ 427/58, 64, 74, 248.1, 282; 118/504
See application file for complete search history.

(56) References Cited

U.S. PATENT DOCUMENTS

| | | | | |
|---|---|---|---|---|
| 5,725,788 A | * | 3/1998 | Maracas ................ | B05D 1/185 216/11 |
| 6,413,587 B1 | * | 7/2002 | Hawker ................ | B05D 1/185 427/264 |
| 6,518,168 B1 | * | 2/2003 | Clem .................... | B05D 1/283 257/E21.171 |
| 7,635,652 B2 | * | 12/2009 | Chang ....................... | G03F 1/48 148/DIG. 106 |
| 8,858,813 B2 | * | 10/2014 | Zu .......................... | B05D 1/185 216/37 |

(Continued)

FOREIGN PATENT DOCUMENTS

| | | |
|---|---|---|
| JP | 2011-214078 | 10/2011 |
| KR | 10-2007-0013441 | 1/2007 |

(Continued)

*Primary Examiner* — Brian K Talbot
(74) *Attorney, Agent, or Firm* — H.C. Park & Associates, PLC (57) ABSTRACT

A mask assembly includes a mask including an opening forming a pattern, an intermediate layer disposed on at least a portion of the mask, and a self-assembled monolayer (SAM) disposed on at least a portion of the intermediate layer.

5 Claims, 3 Drawing Sheets

(56) References Cited

U.S. PATENT DOCUMENTS

| | | | | |
|---|---|---|---|---|
| 2006/0012079 | A1* | 1/2006 | Jung | B29C 33/58 264/338 |
| 2008/0003727 | A1* | 1/2008 | Jinbo | H01L 27/1266 438/149 |
| 2009/0258303 | A1* | 10/2009 | Ryu | G03F 1/68 430/5 |
| 2013/0133573 | A1* | 5/2013 | Joo | C23C 14/042 118/504 |
| 2016/0111681 | A1* | 4/2016 | Kim | C23C 14/042 438/26 |

FOREIGN PATENT DOCUMENTS

| | | |
|---|---|---|
| KR | 10-2008-0000432 | 1/2008 |
| KR | 10-2013-0057794 | 6/2013 |
| KR | 10-2016-0046071 | 4/2016 |

\* cited by examiner

METHOD OF MANUFACTURING DISPLAY APPARATUS UTILIZING MASK ASSEMBLY INCLUDING INTERMEDIATE LAYER AND SELF-ASSEMBLED MONOLAYER

CROSS-REFERENCE TO RELATED APPLICATION

This application claims priority from and the benefit of Korean Patent Application No. 10-2015-0150267, filed on Oct. 28, 2015, which is hereby incorporated by reference for all purposes as if fully set forth herein.

BACKGROUND

Field

One or more exemplary embodiments relate to a method and apparatus, and, more particularly, to a mask assembly, and a method and apparatus for manufacturing a display apparatus.

Discussion

Mobile electronic devices, such as mobile phones, notebook computers, personal digital assistants, tablets, etc., are widely used. These devices typically include a display unit to provide users with visual information, such as an image or video information, in order to support various functions. Components for driving display units have become smaller, but the display units themselves have become more important in conventional mobile electronic devices. It is also noted that a structure for bending a display unit from a first (e.g., flat) state to a second (e.g., bended at a certain angle) state has been developed.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a mask assembly, an apparatus for manufacturing a display apparatus, and a method of manufacturing a display apparatus.

Additional aspects will be set forth in the detailed description which follows, and, in part, will be apparent from the disclosure, or may be learned by practice of the inventive concept.

According to one or more exemplary embodiments, a mask assembly includes a mask including an opening forming a pattern, an intermediate layer disposed on at least a portion of the mask, and a self-assembled monolayer (SAM) disposed on at least a portion of the intermediate layer.

According to one or more embodiments, an apparatus for manufacturing a display apparatus includes: a chamber; a deposition source disposed in the chamber, the deposition source being configured to accommodate and discharge a deposition material; and a mask spaced apart from the deposition source. The mask includes an opening forming a pattern in the mask; an intermediate layer disposed on at least a portion of the mask; and a self-assembled monolayer (SAM) disposed on at least a portion of the intermediate layer.

According to one or more embodiments, a method of manufacturing a display apparatus includes: causing, at least in part, a substrate and a mask to be arranged in a chamber; and causing, at least in part, a deposition material to be ejected from a deposition source and deposited on the substrate according to an opening in the mask. The mask includes an intermediate layer disposed on at least a portion of the mask, and a self-assembled monolayer (SAM) disposed on at least a portion of the intermediate layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
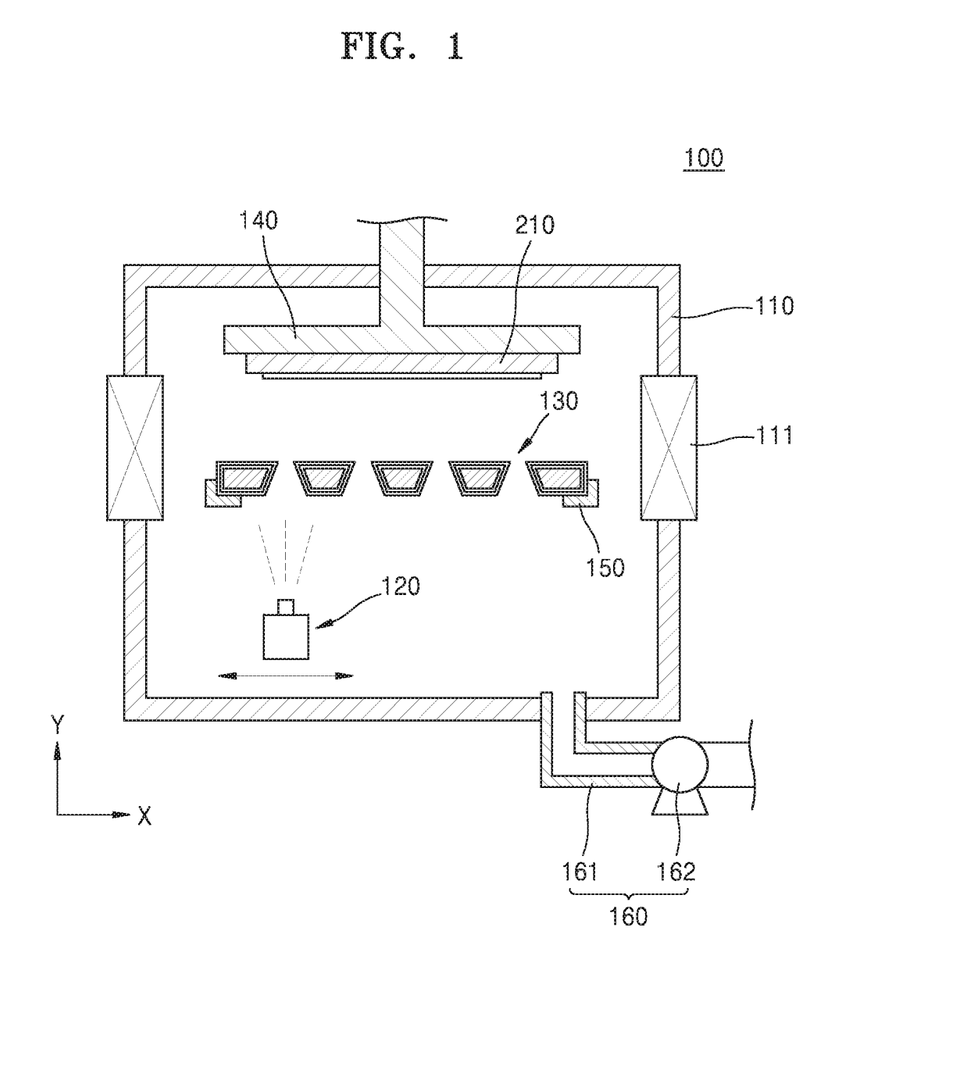
FIG. 1 is a conceptual view of an apparatus for manufacturing a display apparatus, according to one or more exemplary embodiments.
Figure 2:
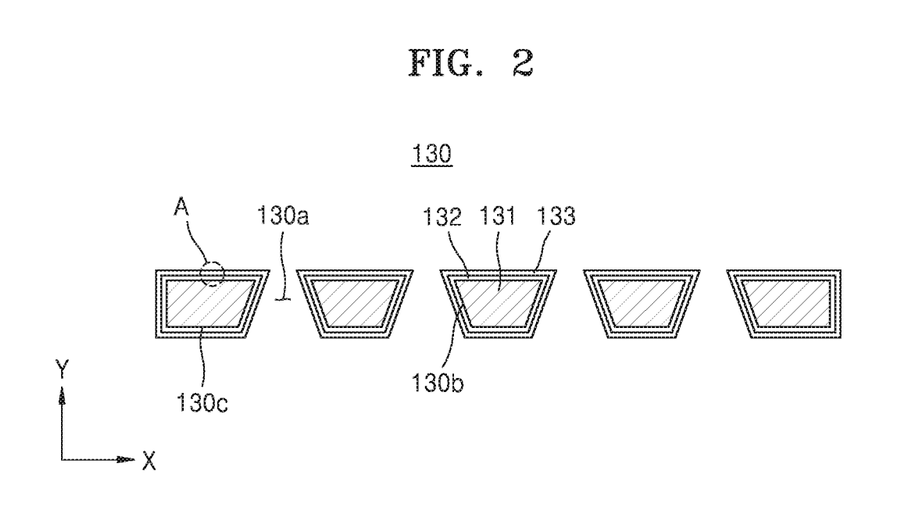
FIG. 2 is a conceptual view of a mask, according to one or more exemplary embodiments.
Figure 3:
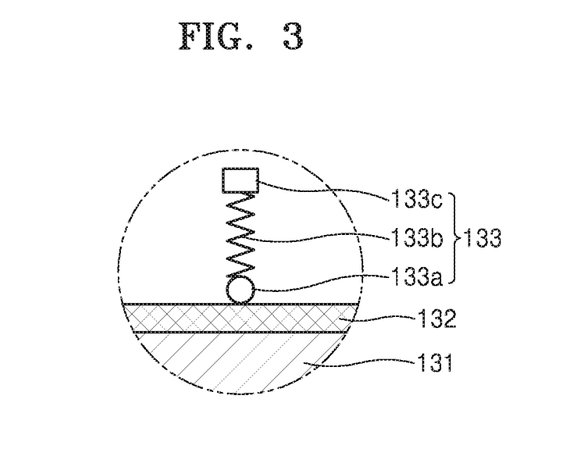
FIG. 3 is an enlarged view of portion A of the mask of FIG. 2, according to one or more exemplary embodiments.

FIG. 1 is a conceptual view of an apparatus for manufacturing a display apparatus, according to one or more exemplary embodiments. FIG. 2 is a conceptual view of a mask, according to one or more exemplary embodiments. FIG. 3 is an enlarged view of portion A of the mask of FIG. 2, according to one or more exemplary embodiments.

Referring to FIGS. 1 through 3, the apparatus 100 for manufacturing a display apparatus may include a chamber 110, a deposition source 120, a mask assembly 130, a substrate fixing unit 140, a mask supporting unit 150, and an inhalation unit 160. Although specific reference will be made to this particular implementation, it is also contemplated that the apparatus 100 may embody many forms and include multiple and/or alternative components and features.

An inner space may be formed in the chamber 110, and the mask assembly 130 and a substrate 210 may be inserted into and arranged in the chamber 110. The inner space of the chamber 110 may be shielded (e.g., completely shielded) from an outside environment, and may be connected to the outside environment via a gate valve 111.

The deposition source 120 may evaporate a deposition material and inject the deposition material to the outside. The deposition material may vary. For example, the deposition material may include a metal material for forming a cathode electrode, an organic material for forming an organic emission layer, etc. According to one or more exemplary embodiments, the deposition material may include an organic material for forming an organic layer of a thin film encapsulation layer. It is contemplated, however, that the deposition material is not limited to the aforementioned examples, and may include all materials that may be deposited via evaporation to form a display apparatus. For descriptive convenience, an example in which the deposition material is an organic material for forming an organic emission layer will be described in more detail below.

The deposition source 120 may be formed the same or substantially the same as a deposition source generally used in a process of manufacturing a display apparatus. For instance, the deposition source 120 may include a crucible, in which a deposition material is disposed, a heater formed to surround an outer surface of the crucible and heat the crucible, and a nozzle formed in the crucible to discharge an evaporated deposition material to the outside. It is contemplated, however, that any other suitable deposition source may be utilized in association with exemplary embodiments described herein.

The mask assembly 130 may include an opening 130a for forming a pattern on the substrate 210. The opening 130a may be formed to have a slot shape or a hole shape, and may be formed in a multiple number. For example, a plurality of openings 130a may be spaced apart from each other by a certain distance, e.g., pitch. The mask assembly 130 may include a mask 131 including the opening 130a. The mask 131 may include a metal material. The mask assembly 130 may include an intermediate layer 132 coated on at least a portion of the mask 131, and a self-assembled monolayer (SAM) 133 coated on at least a portion of the intermediate layer 132.

According to one or more exemplary embodiments, the intermediate layer 132 may include at least one of aluminum, aluminum oxide, aluminum hydroxide, alumino-silicate, silicon dioxide, copper, tin dioxide, talc, and an inorganic oxide. The intermediate layer 132 may be coated on various locations of the mask 131. For example, the intermediate layer 132 may be coated on a portion of the mask 131 in which the opening 130a is formed. That is, the intermediate layer 132 may be coated only on an inner side surface 130b of the opening 130a. It is also contemplated that the intermediate layer 132 may be coated on the inner side surface 130b of the opening 130a and on a surface 130c of the mask 131, the surface 130c facing the deposition source 120. Further, the intermediate layer 132 may be coated on the entire surface of the mask 131 including the inner side surface 130b of the opening 130a. Hereinafter, for descriptive convenience, an example in which the intermediate layer 132 is coated on the entire surface of the mask 131 will be described in more detail.

Methods of coating the intermediate layer 132 on the mask 131 as described above may vary. For example, a material included in the intermediate layer 132 may be formed on the mask 131 by any one of chemical vapor deposition (CVD), physical vapor deposition (PVD), sputtering, and atomic layer deposition (ALD). For instance, when the intermediate layer 132 is formed by ALD, a layer density may increase so as to effectively prevent invasion of n-methyl-2-pyrrolidone (NMP) when the mask assembly 130 is cleaned.

The SAM 133 may include at least one of trichlorooctadecylsilane (OTS), fluoroctatrichlorosilane (FOTS), and dichlorodimethylsilane (DDMS). According to one or more exemplary embodiments, the SAM 133 may be coated on various locations of the intermediate layer 132. For example, the SAM 133 may be formed on a surface of the intermediate layer 132, the surface being at a side of the opening 130a of the mask 131, from among surfaces of the intermediate layer 132. It is contemplated that the SAM 133 may be coated only on the intermediate layer 132, which is at a side of the inner side surface 130b of the opening 130a. The SAM 133 may be coated on the intermediate layer 132 at the inner side surface 130b of the opening 130a and at the surface 130c of the mask 131 that faces the deposition source 120. Further, the SAM 133 may be coated on the entire surface of the intermediate layer 132 including the surface of the intermediate layer 132, the surface being at a side of the inner side surface 130b of the opening 130a. Hereinafter, for descriptive convenience, an example in which the SAM 133 is coated on the entire surface of the intermediate layer 132 will be described in more detail.

The SAM 133 may include a head unit 133a contacting the intermediate layer 132, a linker 133b connected to the head unit 133a, and a terminal 133c connected to the linker 133b. The linker 133b may include a plurality of alkyl chains. Also, the head unit 133a may be hydrophilic. For instance, the head unit 133a may include silane inducing a strong covalent bond. The terminal 133c may include a functional organic material and may be hydrophobic.

According to one or more exemplary embodiments, the SAM 133 may be coated on the intermediate layer 132 by various methods. For example, materials included in the SAM 133 may be coated on the intermediate layer 132 by liquid phase deposition or vapor phase deposition. It is contemplated that the mask 131 on which the intermediate layer 132 is deposited may be inserted into the chamber 110, and the materials included in the SAM 133 may be evaporated so that the materials are absorbed in the intermediate layer 132 and coated on a surface of the intermediate layer 132. For example, the head unit 133a may be absorbed in the intermediate layer 132 so that the SAM 133 may be absorbed in the intermediate layer 132. The terminal 133c may be disposed to protrude toward the outside, e.g., away from the intermediate layer 132. Also, when vapor phase deposition is used, the SAM 133 may be uniformly coated on the surface of the intermediate layer 132, irrespective of a nano-structure, etc., formed on the surface of the intermediate layer 132 or surface roughness of the intermediate layer 132.

The substrate fixing unit 140 may be provided to fix (or otherwise support) the substrate 210 in the chamber 110. The substrate fixing unit 140 may fix the substrate 210 such that a surface of the substrate 210, on which deposition materials are to be deposited, faces the deposition source 120. The substrate fixing unit 140 may have various shapes. For example, the substrate fixing unit 140 may be formed as an electrostatic chuck on which the substrate 210 is bonded. As another example, the substrate fixing unit 130 may be formed as a clamp or a bracket in which the substrate 210 is mounted. It is contemplated, however, that the substrate fixing unit 140 is not limited thereto, but may include any suitable device for fixing (or supporting) the substrate 210 in chamber 110. For descriptive convenience, an example in which the substrate fixing unit 140 includes an electrostatic chuck will be described in more detail.

The substrate fixing unit 140 may be capable of relative motion with respect to the deposition source 120. For example, the substrate fixing unit 140 may linearly move in one or more directions, or the deposition source 120 may be fixed. It is contemplated that the deposition source 120 may linearly move in one or one more directions with respect to the substrate fixing unit 140, and the substrate fixing unit 140 may be fixed. According to another exemplary embodiment, each of the substrate fixing unit 140 and the deposition source 120 may linearly move in one or one more directions. It is also contemplated that the deposition source 120 and/or the substrate fixing unit 140 may be configured to rotate about one or more axes of rotation. For descriptive convenience, an example in which the substrate fixing unit 140 is fixedly mounted in the chamber 110, and the deposition source 120 is mounted to be capable of linear motion will be described in more detail.

The mask supporting unit 150 may fix (or otherwise support) the mask assembly 130 in chamber 110. The mask supporting unit 150 may fix the mask assembly 130 in a state in which the mask assembly 130 is extended (or stretched or held in tension). For example, the mask supporting unit 150 may fix the mask assembly 130 in a state in which the mask assembly 130 is extended in a length direction thereof with a side surface thereof being clamped by the mask supporting unit 150.

The inhalation unit 160 may be connected to the chamber 110 and may adjust pressure in the chamber 110. The inhalation unit 160 may include a flow pipe 161 connected to the chamber 110 and a pump 162 mounted in (or otherwise connected to) the flow pipe 161.

A method of manufacturing a display apparatus (not shown) using the apparatus 100 will be described.

First various layers may be formed on the substrate 210, and, then, the substrate 210 and the mask assembly 130 may be inserted into the chamber 110. A thin film transistor (not shown), a pixel-defining layer (not shown), etc., may be formed on the substrate 210. After the substrate 210 and the mask assembly 130 are inserted into the chamber 110, the substrate 210 may be fixed to the substrate fixing unit 140 and the mask assembly 130 may be fixed to the mask supporting unit 150. Locations of the substrate 210 and the mask assembly 130 may be arranged in the chamber 110, and deposition materials may be ejected from the deposition source 120. The deposition source 120 may linearly move in a length direction or a width direction of the substrate 210 as part of providing the deposition material towards substrate 210. The deposition material ejected from the deposition source 120 may be deposited on the substrate 210 in a certain pattern according to a configuration of the mask assembly 130. For instance, the deposition material may be deposited on an open portion of the pixel-defining layer previously described.

While the above operations are performed, the mask assembly 130 adheres to the substrate 210. When the deposition material penetrates the opening 130a of the mask assembly 130, the deposition material may be absorbed in the mask assembly 130. According to a conventional deposition process, the deposition is performed in a state in which a surface of the mask is not additionally coated. As such, the deposition material is absorbed in the surface of the mask. The deposition material deposited on the surface of the mask, and a neighboring portion or a side wall of the opening may change an area of the opening or a thickness of the mask at the neighboring portion of the opening. As such, the deposition material flows and is deposited on the mask assembly 130, and, in this manner, the movement path of the deposition material is blocked so that shadow defects may occur on the substrate 210. According to the conventional process, to prevent the aforementioned shadow defects, after the mask assembly 130 is used a predetermined number of times or for a certain period of time, the mask assembly 130 is cleaned to remove the deposition material absorbed in the mask.

According to one or more exemplary embodiments, the mask assembly 130, the apparatus 100 for manufacturing a display apparatus, and the method of manufacturing a display apparatus, utilize the SAM 133 coated on the surface of the mask 131, the surface contacting (or directly contacting) a deposition material. In this manner, absorption of the deposition material in the mask 131 may be prevented (or at least reduced). Also, the intermediate layer 132 may be coated between the mask 131 and the SAM 133, and, as such, adhesion among the mask 131, the intermediate layer 132, and the SAM 133 may be increased.

Generally, the mask 131 includes invar, which is an alloy of iron (Fe) and nickel (Ni). If the intermediate layer 132 including at least one of aluminum, aluminum oxide, aluminum hydroxide, alumino-silicate, silicon dioxide, copper, tin dioxide, talc, and an inorganic oxide, which are materials having stronger adhesion with the SAM 133 than the invar, is coated on the mask 131, and the SAM 133 is coated on the intermediate layer 132, the SAM 133 may be bonded to the mask 131 by a stronger adhesion than when the SAM 133 is directly coated on the mask 131. Accordingly, the durability of the mask assembly 130 is increased, and invasion of water or impurities between the mask 131 and the SAM 133 may be prevented (or at least reduced). For example, since the terminal 133c of the SAM 133 is hydrophobic, the terminal 133c may not react with or be combined with the deposition material. Accordingly, the deposition material may be prevented from being deposited on the SAM 133.

When the deposition is performed using the mask assembly 130 described above, a smaller amount of deposition material may be deposited than when the deposition is performed using a conventional mask. Even when the mask assembly 130 is cleaned using a conventional cleaning method, the SAM 133 is not detached from the mask 131, and, as such, the mask assembly 130 may be continually used. Thus, according to the mask assembly 130, the apparatus 100 for manufacturing a display apparatus, and the method of manufacturing a display apparatus, the mask assembly 130 may be used for a longer period of time. Accordingly, costs and time necessary for manufacturing the display apparatus may be reduced. Also, according to one or more exemplary embodiments, even after the mask assembly 130 is cleaned, the SAM 133 is not removed, and, in this manner, the mask assembly 130 may be permanently used.

According to the mask assembly 130, the apparatus 100 for manufacturing a display apparatus, and the method of manufacturing a display apparatus, deposition materials are prevented from being absorbed in a surface of the mask assembly 130, and, as such, even when display apparatuses are repeatedly manufactured, the deposition material may be formed on the substrate 210 in a certain, intended pattern. Also, according to one or more exemplary embodiments, defect rates of display apparatuses may be minimized, and, as such, the productivity of display apparatus manufacture may be improved.

Figure 4:
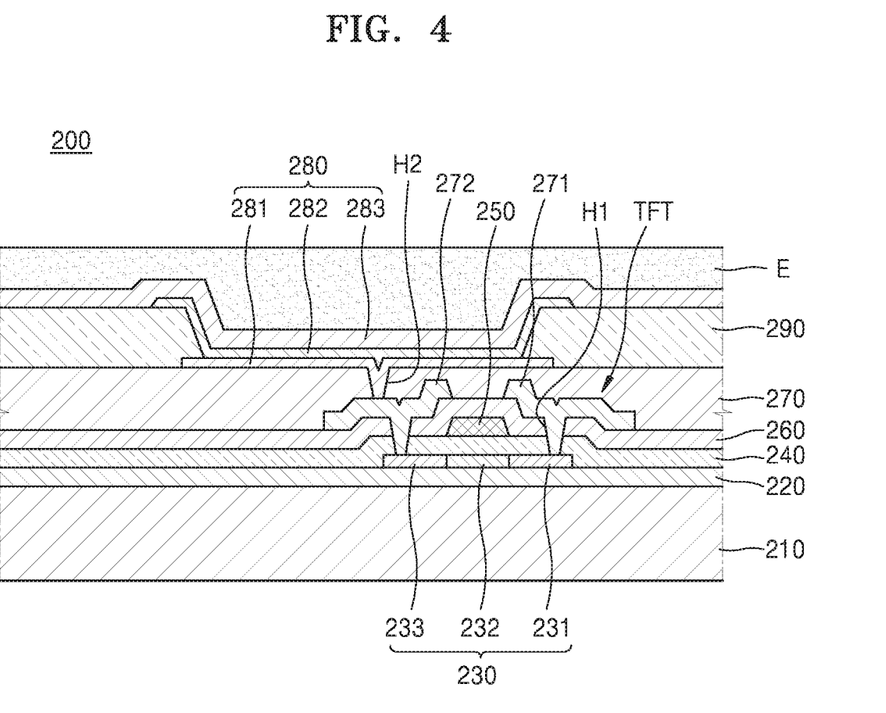
FIG. 4 is a cross-sectional view of a portion of a display apparatus manufactured using the apparatus of FIG. 1 and the mask of FIGS. 2 and 3, according to one or more exemplary embodiments.

FIG. 4 is a cross-sectional view of a portion of a display apparatus manufactured using the apparatus of FIG. 1, according to one or more exemplary embodiments.

Referring to FIG. 4, the display apparatus 200 may include a substrate 210 and a display unit (not shown). Also, the display apparatus 200 may include a thin film encapsulation layer E or an encapsulation substrate (not shown) on the display unit. The encapsulation substrate may be the same or substantially the same as a substrate generally used in a display apparatus, and, as such, a detailed description will be omitted. Also, for descriptive convenience, an example in which the display apparatus 200 includes a thin film encapsulation layer E will be described in more detail.

The display unit may be formed on the substrate 210. According to one or more exemplary embodiments, the display unit may include a thin film transistor TFT. A passivation layer 270 may be formed to cover the display unit. An organic light-emitting device (OLED) 280 may be formed on the passivation layer 270. The substrate 210 may include a glass material; however, it is contemplated that the substrate 210 may include any suitable material, such as a plastic material, a metal material (e.g., stainless steel (SUS), titanium (Ti), etc.), and the like. For instance, the substrate 210 may include polyimide (PI). For descriptive convenience, an example in which the substrate 210 includes a glass material will be described in more detail.

A buffer layer 220 including an organic compound and/or an inorganic compound is formed on the substrate 210. The buffer layer 220 may include silicon oxide ($SiO_x$ ($x \geq 1$)), silicon nitride ($SiN_x$ ($x \geq 1$)), etc. An active layer 230 is formed on the buffer layer 220 in a certain pattern. The active layer 230 is buried by a gate insulating layer 240. The active layer 230 may include a source area 231, a drain area 233, and a channel area 232 disposed between the source area 231 and the drain area 233. The active layer 230 may include various materials. For example, the active layer 230 may include an inorganic semiconductor material, such as amorphous silicon or crystalline silicon. As another example, the active layer 230 may include an oxide semiconductor. As yet another example, the active layer 230 may include an organic semiconductor material. For descriptive convenience, descriptions will be made to an example in which the active layer 230 includes amorphous silicon.

After an amorphous silicon layer is formed on the buffer layer 220, the amorphous silicon layer is crystallized to form a polycrystalline silicon layer. The polycrystalline silicon layer may be patterned to form the active layer 230. The source area 231 and the drain area 233 of the active layer 230 may be doped with impurities depending on types of TFTs, such as a driving TFT (not shown), a switching TFT (not shown), etc., to be formed in association with display apparatus 200.

A gate electrode 250 corresponding to the active layer 230 and an interlayer insulating layer 260 burying the gate electrode 250 are formed on the gate insulating layer 240. A contact hole H1 is formed in the interlayer insulating layer 260 and the gate insulating layer 240. A source electrode 271 and a drain electrode 272 are formed on the interlayer insulating layer 260 to contact the source area 231 and the drain area 233, respectively.

The passivation layer 270 is formed on the TFT, and a pixel electrode 281 of the OLED 280 is formed on the passivation layer 270. The pixel electrode 281 contacts the drain electrode 272 of the TFT via a via hole H2 formed in the passivation layer 270. The passivation layer 270 may include a single layer or multiple layers including an inorganic material and/or an organic material. The passivation layer 270 may be formed as a planarization layer to planarize a layer below the passivation layer 270 despite how curved the layer below the passivation layer 270 is formed. Also, the passivation layer 270 may be formed to be curved in correspondence to a curved layer below the passivation layer 270. The passivation layer 270 may include a transparent insulator in order to achieve a resonance effect.

After the pixel electrode 281 is formed on the passivation layer 270, a pixel-defining layer 290 may be formed including an organic material and/or an inorganic material to cover the pixel electrode 281 and the passivation layer 270. An opening is formed in the pixel-defining layer 290 to expose the pixel electrode 281. Then, an intermediate layer 282 and an opposite electrode 283 are formed at least on the pixel electrode 281. The pixel electrode 281 may function as an anode, and the opposite electrode 283 may function as a cathode. It is contemplated, however, that the polarities of the pixel electrode 281 and the opposite electrode 283 may be the opposite.

The pixel electrode 281 and the opposite electrode 283 are insulated from each other by the intermediate layer 282, and voltages of different polarities may be applied to the intermediate layer 282 so that light can be emitted from an organic emission layer. The intermediate layer 282 may include the organic emission layer. According to another embodiment, the intermediate layer 282 may include the organic emission layer, and may further include at least one of a hole injection layer (HIL), a hole transport layer (HTL), an electron transport layer (ETL), and an electron injection layer (EIL).

A unit pixel P of the display apparatus 200 may include a plurality of sub-pixels, which may emit various colors of light. For example, the plurality of sub-pixels may include sub-pixels R, G, and B configured to emit red, green, and blue colors of light, respectively, and sub-pixels (not shown) which may emit red, green, blue, and white colors of light, respectively. It is contemplated, however, that the sub-pixels and/or unit pixels P may be configured to emit light of any suitable color.

The thin film encapsulation layer E may include a plurality of inorganic layers or may include an inorganic layer and an organic layer. For instance, the organic layer of the thin film encapsulation layer E may include a polymer, and may include a single layer or stacked layers including any one of polyethylene terephthalate, polyimide, polycarbonate, epoxy, polyethylene, and polyacrylate. The organic layer may include polyacrylate. For instance, the organic layer may include a polymerized monomer composition including a diacrylate-based monomer and a triacrylate-based monomer. The monomer composition may further include a monoacrylate-based monomer. Also, the monomer composition may further include a general photoinitiator, such as TPO. It is noted, however, that exemplary embodiments are not limited thereto. The inorganic layer of the thin film encapsulation layer E may include a single layer or stacked layers including a metal oxide or a metal nitride. For example, the inorganic layer may include any one of $SiN_x$, $Al_2O_3$, $SiO_2$, and $TiO_2$.

An uppermost layer of the thin film encapsulation layer E, which is exposed to an outside environment, may include an inorganic layer to prevent water penetration into the OLED 280. The thin film encapsulation layer E may include at least one sandwich structure, in which at least one organic layer is inserted between at least two inorganic layers. As another example, the thin film encapsulation layer E may include at least one sandwich structure, in which at least one inorganic layer is inserted between at least two organic layers. As yet another example, the thin film encapsulation layer E may include at least one sandwich structure, in which at least one organic layer is inserted between at least two inorganic layers, and at least one sandwich structure, in which at least one inorganic layer is inserted between at least two organic layers.

The thin film encapsulation layer E may sequentially include a first inorganic layer, a first organic layer, and a second inorganic layer on the OLED 280 in this order. As another example, the thin film encapsulation layer E may sequentially include a first inorganic layer, a first organic layer, a second inorganic layer, a second organic layer, and a third inorganic layer on the OLED 280 in this order. As yet another example, the thin film encapsulation layer E may sequentially include a first inorganic layer, a first organic layer, a second inorganic layer, a second organic layer, a third inorganic layer, a third organic layer, and a fourth inorganic layer on the OLED 280 in this order. A halogenated metal layer including lithium fluoride (LiF) may further be included between the OLED 280 and the first inorganic layer. The halogenated metal layer may prevent damage to the OLED 280 when the first inorganic layer is formed via, for instance, a sputtering process. An area of the first organic layer may be smaller than an area of the second inorganic layer, and an area of the second organic layer may be smaller than an area of the third inorganic layer.

According to one or more exemplary embodiments, deposition of deposition materials on a surface of the mask assembly 131 may be prevented (or at least reduced) and durability of the mask assembly 131 may be improved.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a display apparatus, the method comprising:
   causing, at least in part, a substrate of the display apparatus and a mask to be arranged in a chamber; and
   causing, at least in part, a deposition material to be ejected from a deposition source and deposited on the substrate according to an opening in the mask,
   wherein the mask comprises:
      a main body;
      an intermediate layer disposed on at least a portion of the main body; and
      a self-assembled monolayer (SAM) disposed on at least a portion of the intermediate layer such that, in a direction normal to a surface of the main body, the intermediate layer is disposed between the SAM and the main body,
   wherein the main body comprises a metal material, and
   wherein the intermediate layer and the SAM completely surround the main body.

2. The method of claim 1, wherein the SAM comprises at least one of trichlorooctadecylsilane (OTS), fluoroctatrichlorosilane (FOTS), and dichlorodimethylsilane (DDMS).

3. The method of claim 1, wherein the intermediate layer is coated on the mask via one of a chemical vapor deposition (CVD) process, a physical vapor deposition (PVD) process, a sputtering process, or and an atomic layer deposition (ALD) process.

4. The method of claim 1, wherein the SAM is coated on the intermediate layer by a vapor phase deposition.

5. The method of claim 1, wherein the SAM directly contacts and is absorbed into the portion of the intermediate layer.

* * * * *